(12) United States Patent
Gasanov et al.

(10) Patent No.: US 7,003,739 B2
(45) Date of Patent: Feb. 21, 2006

(54) METHOD AND APPARATUS FOR FINDING OPTIMAL UNIFICATION SUBSTITUTION FOR FORMULAS IN TECHNOLOGY LIBRARY

(75) Inventors: Elyar E. Gasanov, Moscow (RU); Alexander S. Podkolzin, Moscow (RU); Alexei V. Galatenko, Moscow (RU)

(73) Assignee: LSI Logic Corporation, Milpitas, CA (US)

( * ) Notice: Subject to any disclaimer, the term of this patent is extended or adjusted under 35 U.S.C. 154(b) by 189 days.

(21) Appl. No.: 10/719,787

(22) Filed: Nov. 21, 2003

(65) Prior Publication Data

US 2005/0114804 A1    May 26, 2005

(51) Int. Cl.
   *G06F 17/50*    (2006.01)
(52) U.S. Cl. .................... 716/1; 716/2; 716/3; 716/8
(58) Field of Classification Search ............. 716/1, 716/2, 3, 8, 11
   See application file for complete search history.

(56) References Cited

U.S. PATENT DOCUMENTS

| | | | | |
|---|---|---|---|---|
| 6,392,653 | B1 * | 5/2002 | Malandain et al. | 345/501 |
| 6,532,582 | B1 * | 3/2003 | Zolotykh et al. | 716/11 |
| 6,543,032 | B1 * | 4/2003 | Zolotykh et al. | 716/2 |
| 6,564,361 | B1 * | 5/2003 | Zolotykh et al. | 716/8 |
| 6,587,990 | B1 * | 7/2003 | Andreev et al. | 716/2 |
| 6,637,011 | B1 * | 10/2003 | Zolotykh et al. | 716/3 |
| 6,681,222 | B1 * | 1/2004 | Kabra et al. | 707/5 |
| 6,681,373 | B1 * | 1/2004 | Zolotykh et al. | 716/2 |

\* cited by examiner

*Primary Examiner*—Vuthe Siek
(74) *Attorney, Agent, or Firm*—Suiter West Swantz PC LLO

(57) ABSTRACT

The present invention is directed to a method and apparatus to find an optimal unification substitution for formulas in a technology library. In an exemplary aspect of the present invention, a method for finding an optimal unification substitution for formulas in a technology library during integrated circuit design may include the following steps: (a) receiving input including a list L of pairs of formulas in standard form, a set S of substitutions for variables, a right part $e(x_1, \ldots, x_p)$ of an identity, and an information $I=\{t, h, r, a, p\}$ on best application; (b) when the list L is not empty, extracting and removing first pair $(f'(A'_1, \ldots, A'_{n'}), g'(B'_1, \ldots, B'_{m'}))$ from the list L; (c) removing head inverters and buffers from formulas $f'(A'_1, \ldots, A'_{n'})$ and $g'(B'_1, \ldots, B'_{m'})$ and obtaining a pair $(f(A_1, \ldots, A_n), g(B_1, \ldots, B_m))$; (d) when the $f$ is a commutative operation but neither a variable nor constant, and when heads of the formulas $f(A_1, \ldots, A_n)$ and $g(B_1, \ldots, B_m)$ are equal, searching for a basic argument $A_j$ of the formula $f(A_1, \ldots, A_n)$; (e) when the basic argument $A_j$ is found, letting P be head of said $A_j$ and setting $i=1$; (f) when head of $B_i$ is equal to the P, making copy L' of the list L and making copy S' of the set S; and (g) forming a reduced pair (A', B') for pairs $(f(A_1, \ldots, A_n), f(B_1, \ldots, B_n))$ and $(A_j, B_i)$ and adding the pairs $(A_j, B_i)$ and (A', B') to the list L'.

22 Claims, 6 Drawing Sheets

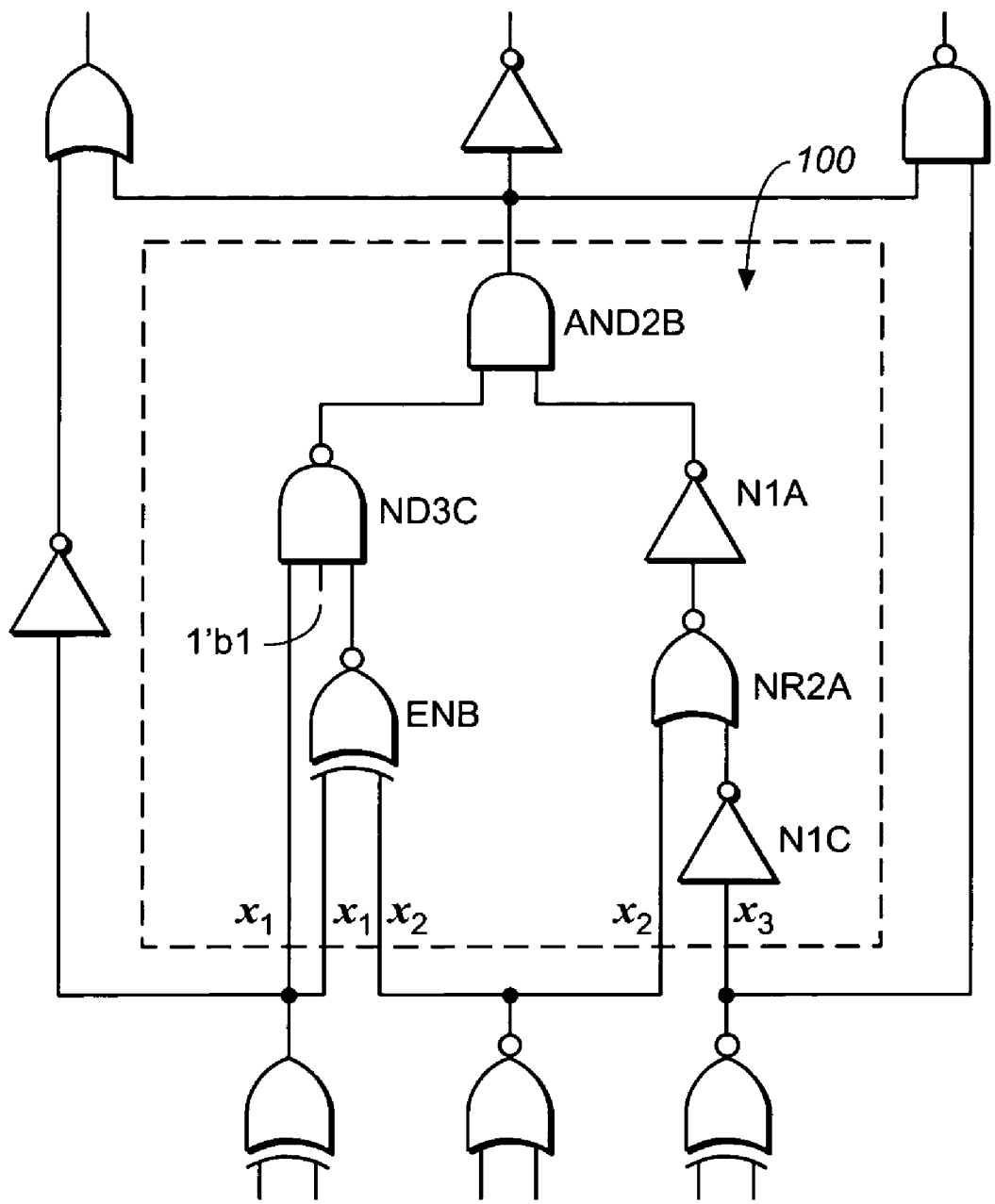
FIG._1

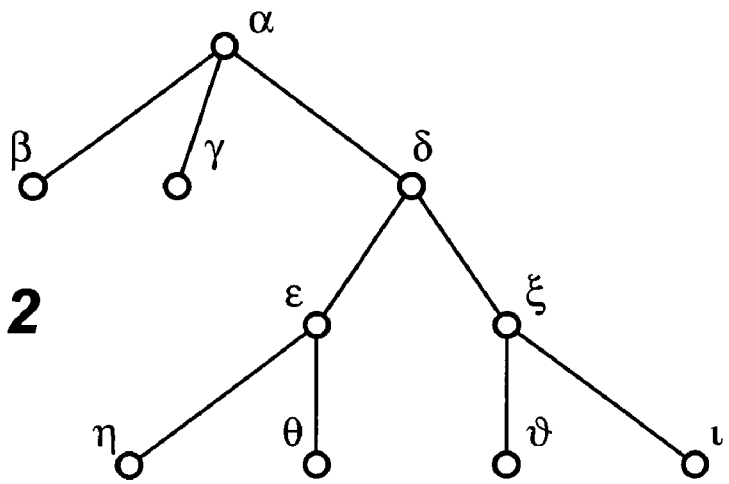
FIG._2
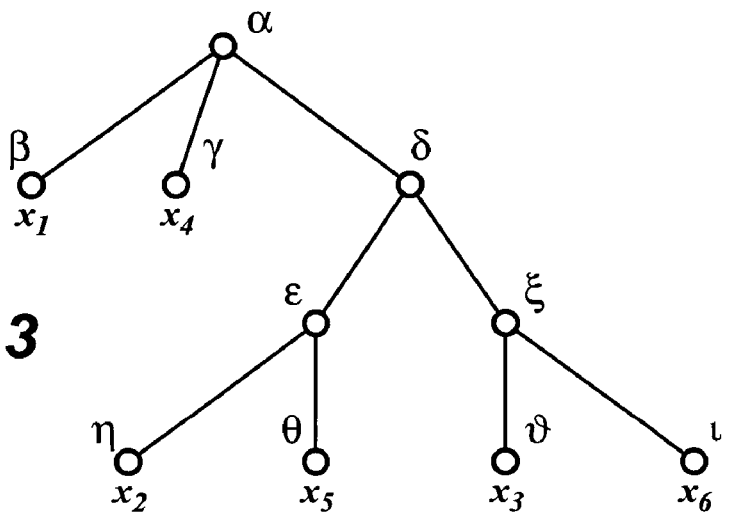
FIG._3
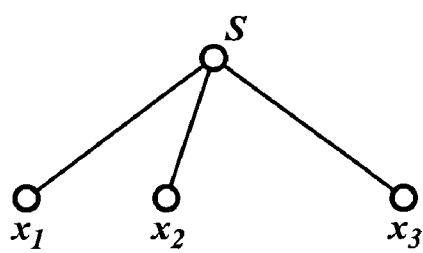
FIG._4

FIG._5
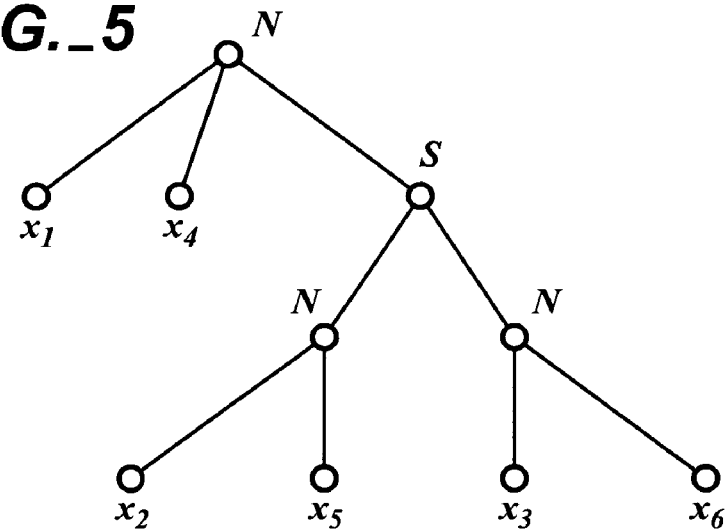
FIG._6
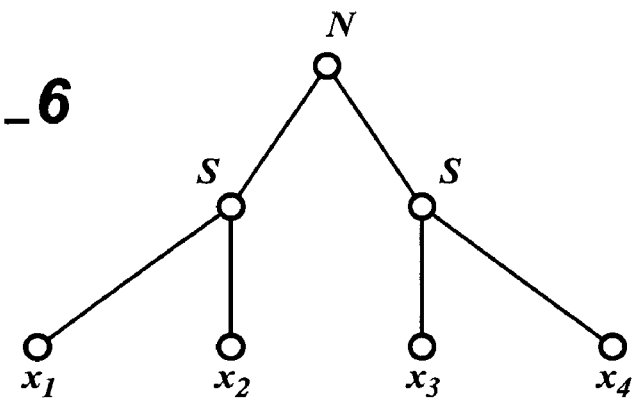
FIG._7
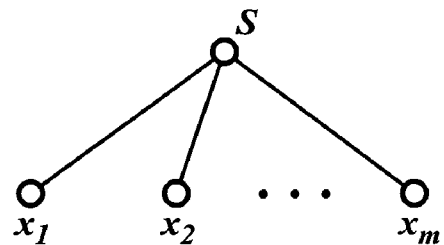

FIG._8
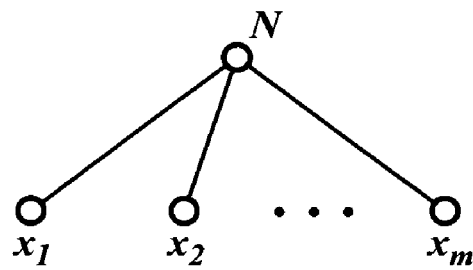
FIG._9
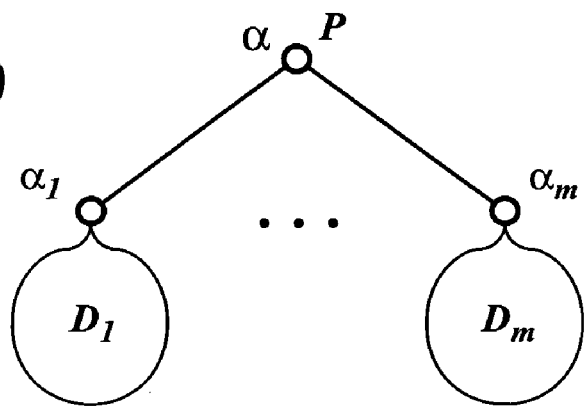
FIG._10
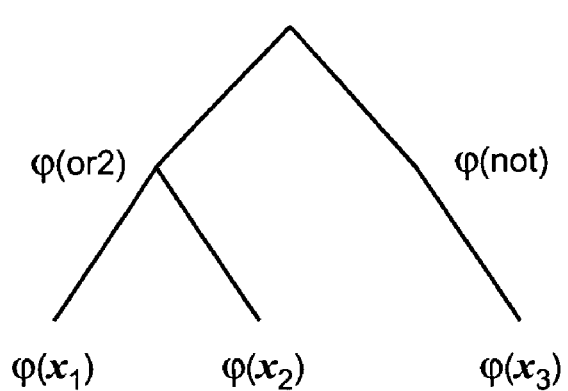

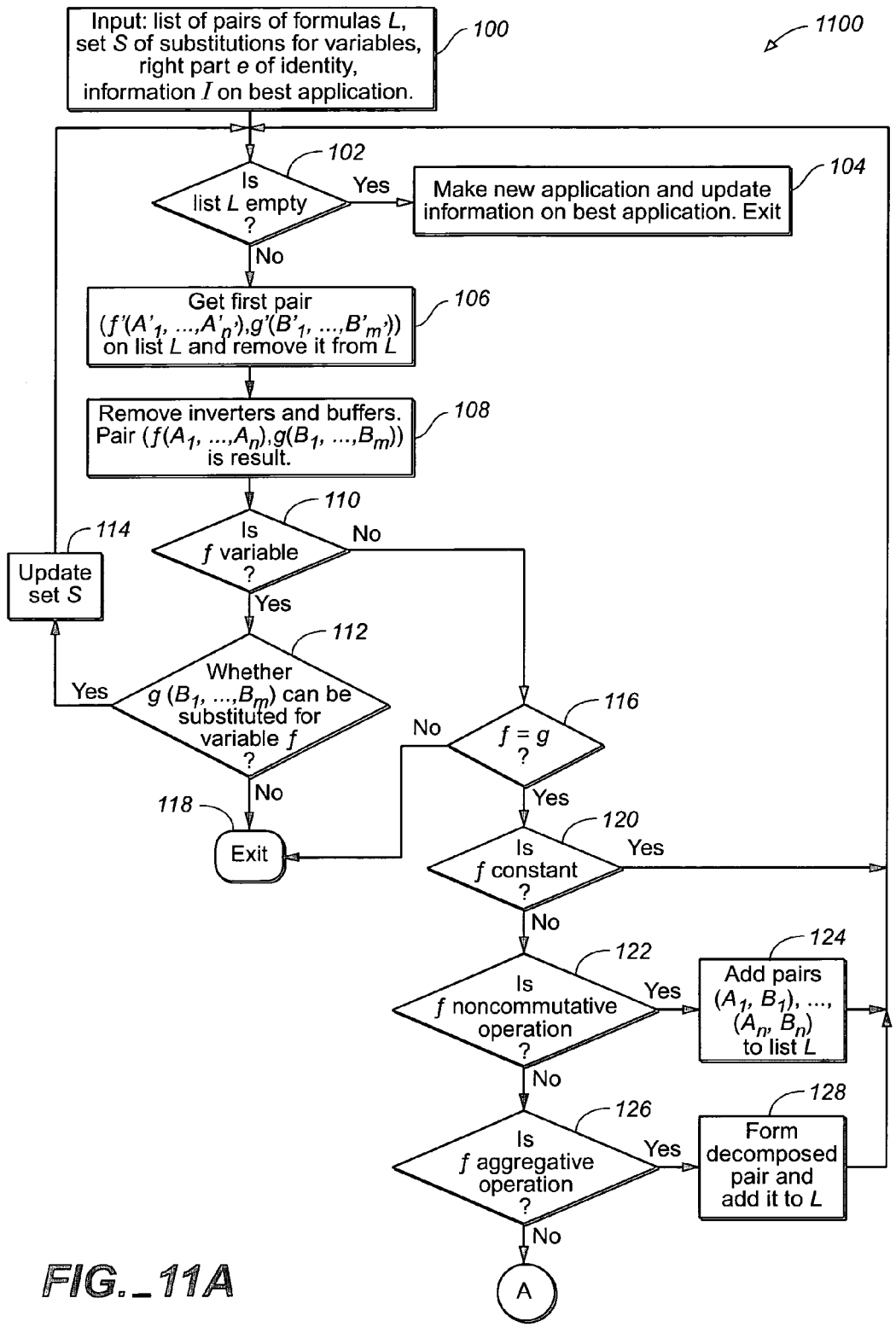
FIG._11A

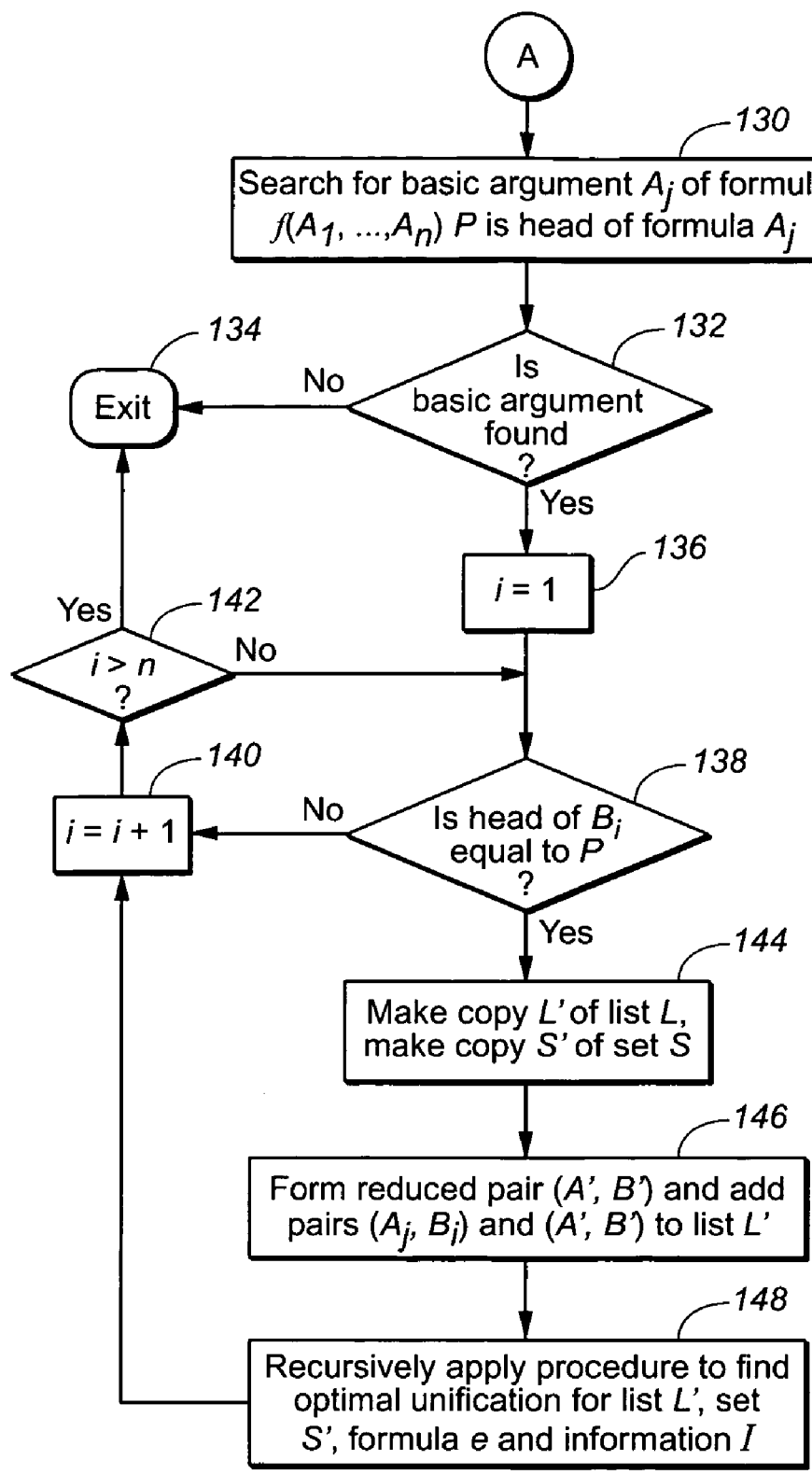
FIG._11B

US 7,003,739 B2

METHOD AND APPARATUS FOR FINDING OPTIMAL UNIFICATION SUBSTITUTION FOR FORMULAS IN TECHNOLOGY LIBRARY

CROSS-REFERENCE TO RELATED DOCUMENTS

The present application herein incorporates U.S. Pat. No. 6,543,032, issued to Zolotykh, et al. and entitled "Method and Apparatus for Local Resynthesis of Logic Trees with Multiple Cost Functions"; U.S. Pat. No. 6,532,582, issued to Zolotykh, et al. and entitled "Method and Apparatus for Optimal Critical Netlist Area Selection"; U.S. Pat. No. 6,637,011, issued to Zolotykh, et al. and entitled "Method and Apparatus for Quick Search for Identities Applicable to Specified Formula"; and U.S. Pat. No. 6,564,361, issued to Zolotykh, et al. and entitled "Method and Apparatus for Timing Driven Resynthesis" by reference in their entirety.

The present application herein incorporates the following U.S. patent application by reference in its entirety:

| Attorney Docket Number | Serial No. | Filing Date |
| --- | --- | --- |
| U.S. Pat. No. 6,868,536 | 10/299,564 | Nov. 19, 2002 |

FIELD OF THE INVENTION

The present invention generally relates to integrated circuits (ICs), and particularly to a method and apparatus for finding an optimal unification substitution for formulas in a technology library.

BACKGROUND OF THE INVENTION

IC chips generally comprise a plurality of cells. Each cell may include one or more circuit elements such as transistors, capacitors and other basic circuit elements, which are interconnected in a standardized manner to perform a specific function.

Timing Driven Resynthesis described in U.S. Pat. No. 6,564,361, filed Oct. 2, 2000 has been used to change the chip design step by step, making the improvements of the chip locally. The main idea of the local resynthesis is to consecutively examine the cell trees of a chip for the necessity of optimization, and then to organize the chosen trees as local tasks for the resynthesis that follows. All necessary information about the tree neighborhood (neighboring cells, capacities, delays, etc.) is first collected. Next, local optimization procedures work with this information only. No additional information about the chip structure is required. A net may include a wire and a set of cell pins connected to the wire.

Within the logical resynthesis, ordinary logical cells are considered, i.e. those cells with one output pin constructed using standard logical gates NOT, AND, OR. A logical tree is a tree formed from ordinary logical cells. Inside a logical tree, except the root (or root cell) of the tree, the output pin of each cell of the tree is connected to exactly one other input pin, and this one other input pin is a pin of a cell of the logical tree. In contrast, the output pin of the root may be connected to any number of cell input pins. All cells connected to the output pin of the root of a tree may not belong to the tree, and the cells are not necessarily logical. An input pin of a cell of the tree may be connected to the power or the ground. Moreover, a cell input pin of a tree may be connected to a cell outside the tree, and the cell input pin may be called the entrance of the tree.

FIG. 1 shows an exemplary logical tree 100. The tree 100 may include 6 cells drawn inside the dotted rectangle. All entrances of the tree 100 may be enumerated by assigning variables $x_n$ to the entrances. In addition, identical variables may be assigned to entrances connected through a wire because the input values of these entrances are always the same. As shown, for example, the variable $x_1$ is assigned to the first input pin of the cell ND3C and to the first input pin of the cell ENB, the variable $x_2$ is assigned to the second input pin of the cell ENB and to the first input pin of the cell NR2A, and the variable $x_3$ is assigned to the input pin of the cell N1C.

A logical tree may be presented as a logical expression on the technology basis. For instance the tree 100 shown in FIG. 1 may be presented as the following logical expression:

AND2B(ND3C($x_1$, 1, ENB($x_1$, $x_2$)), N1A(NR2A($x_2$, N1C($x_3$)))).

One goal of the logical resynthesis is to change a logical expression into a logically equivalent one, which is better with respect to a given estimator.

The method of identities is a known method to find logically equivalent formulas and assumes that unification substitutions for formulas may be found. Let A=B be an identity, i.e. a pair of equivalent formulas on some bases. For example, and2(not($x_1$), $x_2$)=not (or2(not($x_2$), $x_1$)) is an identity. Let C be a formula on a basis, for example, and2(not (or2($x_3$, $x_4$)), not ($x_5$)). If A($x_1$, ..., $x_n$) and A($D_1$, ..., $D_n$)=C, where $D_1$, ..., $D_n$ are formulas, then the substitution $x_i \to D_i$ (i=1, ..., n) may be called unification substitution for formulas A and C. To apply the identity A=B to the formula C, unification substitution for formulas A and C need be found. There are 2 unification substitutions for formulas and2(not($x_1$), $x_2$) and and2(not(or2($x_3$, $x_4$)), not ($x_5$)):

a) $x_1 \to $or2($x_3$, $x_4$), $x_2 \to $not($x_5$),
b) $x_1 \to x_5$, $x_2 \to $not(or2($x_3$, $x_4$)).

Therefore, there are two results of application of the identity and2(not($x_1$), $x_2$)=not(or2(not($x_2$), $x_1$)) to formula and2(not (or2($x_3$, $x_4$)), not($x_5$)) as follows:

a) not(or2(not(not($x_5$)), or2($x_3$, $x_4$))),
b) not(or2(not(not(or2($x_3$, $x_4$))), $x_5$)).

The application of an identity to a formula has been described in U.S. Pat. No. 6,543,032, filed Oct. 2, 2000 and in U.S. Pat. No. 6,637,011, filed Oct. 2, 2000, and has been used for logical resynthesis in LSI Logic Corp.'s internal synthesis tool MRS to minimize the path delays and eliminate the ramptime violations (see e.g., U.S. Pat. No. 6,564, 361, filed Oct. 2, 2000). However, if there are several unification substitutions, then the best substitution need be selected to minimize the path delays or eliminate the ramptime violations.

Therefore, it would be desirable to provide a method and apparatus to quickly find an optimal unification substitution for formulas in a technology library.

SUMMARY OF THE INVENTION

Accordingly, the present invention is directed to a method and apparatus to find an optimal unification substitution for formulas in a technology library. In an exemplary aspect of the present invention, a method for finding an optimal unification substitution for formulas in a technology library during integrated circuit design may include the following steps: (a) receiving input including a list L of pairs of formulas in standard form, a set S of substitutions for variables, a right part $e(x_1, \ldots, x_p)$ of an identity, and an information I={t, h, r, a, p} on best application; (b) when the list L is not empty, extracting and removing first pair $(f'(A'_1, \ldots, A'_{n'}), g'(B'_1, \ldots, B'_{m'}))$ from the list L; (c) removing head inverters and buffers from formulas $f'(A'_1, \ldots, A'_{n'})$ and $g'(B'_1, \ldots, B'_{m'}))$ and obtaining a pair $(f(A_1, \ldots, A_n), g(B_1, \ldots, B_m))$; (d) when the $f$ is a commutative operation but neither a variable nor constant, and when heads of the formulas $f(A_1, \ldots, A_n)$ and $g(B_1, \ldots, B_m)$ are equal, searching for a basic argument $A_j$ of the formula $f(A_1, \ldots, A_n)$; (e) when the basic argument $A_j$ is found, letting P be head of said $A_j$ and setting i=1; (f) when head of $B_i$ is equal to the P, making copy L' of the list L and making copy S' of the set S; and (g) forming a reduced pair (A', B') for pairs $(f(A_1, \ldots, A_n), f(B_1, \ldots, B_n))$ and $(A_j, B_i)$ and adding the pairs $(A_j, B_i)$ and (A', B') to the list L'.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 shows an exemplary logical tree;

FIG. 2 shows an exemplary tree, where the root, nodes, and leaves are shown;

FIG. 3 shows an exemplary tree, where a variable is assigned to each leaf of the tree;

FIG. 4 shows an exemplary symmetry tree for the function and3 in accordance with the present invention;

FIG. 5 shows an exemplary symmetry tree for the function mux41 in accordance with the present invention;

FIG. 6 shows an exemplary symmetry tree for the function $x_1 x_2 \rightarrow x_3 \vee x_4 = \bar{x}_1 \vee \bar{x}_2 \vee x_3 \vee x_4$ in accordance with the present invention;

FIG. 7 shows an exemplary symmetry tree for a m-commutative cell in accordance with the present invention, where the root of the symmetry tree is marked by a symbol S;

FIG. 8 shows an exemplary symmetry tree for a m-non-commutative cell in accordance with the present invention, where the root of the symmetry tree is marked by a symbol N;

FIG. 9 shows an exemplary symmetry tree for an aggregative cell of a technology library in accordance with the present invention;

FIG. 10 shows an exemplary representation of the formula and2(or2($x_1$, $x_2$), not($x_3$)) in accordance with the present invention; and FIGS. 11A and 11B illustrate a flowchart showing an exemplary method for finding an optimal unification substitution in accordance with the present invention.

DETAILED DESCRIPTION OF THE INVENTION

Reference will now be made in detail to the presently preferred embodiments of the invention, examples of which are illustrated in the accompanying drawings.

A. Symmetry Tree of Boolean Function

The present invention utilizes the Boolean function symmetries described in co-pending U.S. patent application Ser. No. 10/299,564, filed Nov. 19, 2002 now U.S. Pat. No. 6,868,536.

Many Boolean functions have commutative variables. Variables of a Boolean function are commutative if after any permutation of these variables the value of the function is not changed. For example, all variables of the disjunction function and3($x_1$, $x_2$, $x_3$)=$x_1 x_2 x_3$ are commutative. In contrast, the implication function $x_1 \rightarrow x_2 = \bar{x}_1 \vee x_2$ has no commutative variables. The multiplexer function mux41($x_1$, $x_2$, $x_3$, $x_4$, $x_5$, $x_6$)=$x_1 \bar{x}_5 \bar{x}_6 \vee x_2 \bar{x}_5 x_6 \vee x_3 x_5 \bar{x}_6 \vee x_4 x_5 x_6$ has no commutative variables. However, if both permutations $x_2$ with $x_3$ and $x_5$ with $x_6$ are made, then the function is not changed, i.e. the groups of the variables $\{x_2, x_5\}$ and $\{x_3, x_6\}$ are commutative.

Data structure which describes groups of commutative variables of a Boolean function is called symmetry of the Boolean function. Specifically, symmetry tree of Boolean function may be defined as follows.

Let $X=\{x_1, \ldots, x_n\}$ be a set of variables and $f(x_1, \ldots, x_n)$ be a Boolean function. If $i,j \in \{1, 2, \ldots, n\}$, $i \neq j$ then denote $$P^i_j(f(x_1, \ldots, x_{i-1}, x_i, x_{i+1}, \ldots, x_{j-1}, x_j, x_{j+1}, \ldots, x_n)) = f(x_1, \ldots, x_{i-1}, x_j, x_{i+1}, \ldots, x_{j-1}, x_i, x_{j+1}, \ldots, x_n).$$

Those of ordinary skill in the art will understand that $P^i_j(f)=P^j_i(f)$.

Let $X_1=\{X_{i_1}, \ldots, X_{i_m}\} \subseteq X$, $X_2=\{X_{j_1}, \ldots, X_{j_m}\} \subseteq X$ be ordered sets of variables such that $i_p \neq i_q$ and $j_p \neq j_q$ if $p \neq q$. $X_1$ and $X_2$ are defined to be symmetric with respect to the function $f$ if $X_1 \cap X_2 = \emptyset$ and $P^{i_1}_{j_1}(P^{i_2}_{j_2}(\ldots P^{i_m}_{j_m}(f(x_1, \ldots, x_n))\ldots))=f(x_1, \ldots, x_n)$. Those of ordinary skill in the art will understand that $\emptyset$ represents an empty set or zero pointer. A set of ordered sets of variables $\{X_1, \ldots, X_k\}$ ($X_1, \ldots, X_k \subseteq X$, $k \geq 2$) is defined to be symmetric with respect to the function $f$ if for each $i,j \in \{1, 2, \ldots, k\}$, $i \neq j$, $X_i$ and $X_j$ are symmetric with respect to the function $f$. A set of ordered sets of variables $\{X_1, \ldots, X_k\}$ ($X_1, \ldots, X_k \subseteq X$, $k \geq 2$) is defined to be maximal symmetric with respect to the function $f$ if $\{X_1, \ldots, X_k\}$ is symmetric with respect to the function $f$ and for each $X' \subseteq X$, $\{X_1, \ldots, X_k, X'\}$ is not symmetric with respect to function $f$.

The following are some examples of symmetric sets of ordered sets of variables.

Let mux41($x_1$, $x_2$, $x_3$, $x_4$, $x_5$, $x_6$)=$x_1 \bar{x}_5 \bar{x}_6 \vee x_2 \bar{x}_5 x_6 \vee x_3 x_5 \bar{x}_6 \vee x_4 x_5 x_6$ and3($x_1$, $x_2$, $x_3$)=$x_1 x_2 x_3$. The set $\{\{x_1\}, \{x_2\}\}$ is symmetric with respect to the function and3 but is not maximal symmetric. The set $\{\{x_1\}, \{x_2\}, \{x_3\}\}$ is maximal symmetric with respect to the function and3. The set $\{\{x_2, x_5\}, \{x_3, x_6\}\}$ is maximal symmetric with respect to the function mux41.

A set of variables $X' \subseteq X$ is S-set of a function $f$ if there are sets $X_1, \ldots, X_k \subseteq X$, $k \geq 2$ such that $X_1 \cup \ldots \cup X_k = X'$ and $\{X_1, \ldots, X_k\}$ is symmetric with respect to function $f$. For example, $\{x_1, x_2\}$ and $\{x_1, x_2, x_3\}$ are S-sets of and3, $\{x_2, x_3, x_5, x_6\}$ is S-set of mux41, and $\{x_1, x_2, x_3, x_4, x_5, x_6\}$ is not S-set of mux41.

If $X' \subseteq X$ is S-set of a function $f$, $X_1 \cup \ldots \cup X_k = X'$, and $\{X_1, \ldots, X_k\}$ is symmetric with respect to the function $f$, then $\{X_1, \ldots, X_k\}$ is called S-partition of X'. $\{X_1, \ldots, X_k\}$ is called maximal S-partition of X' if $\{X_1, \ldots, X_k\}$ is S-partition of X' and k is maximal cardinality of S-partitions of X'. Cardinality of a set A is the number of elements in the set A.

A tree is a graph without loops and with a pole called root. FIG. 2 shows an exemplary tree D. As shown, the node $\alpha$ is the root of the tree D, the nodes $\beta$, $\gamma$, $\delta$ are sons of the node $\alpha$, the nodes $\epsilon$, $\zeta$ are sons of the node $\delta$, the nodes $\eta$, $\theta$ are sons of the node $\epsilon$, the nodes $\partial$, $\iota$ are sons of the node $\zeta$, the nodes $\beta$, $\gamma$, $\eta$, $\theta$, $\partial$, $\iota$ are leaves of the tree D, and the nodes $\alpha$, $\delta$, $\epsilon$, $\zeta$ are internal nodes of the tree D.

Let D be a tree with n leaves. To each leaf of the tree D, a variable from $X=\{x_1, \ldots, x_n\}$ may be assigned. If $\beta$ is a node of the tree D, then $A_\beta$ is the ordered set of variables which is assigned to leaves of the branch with root $\beta$. The order of variables may be determined by the depth-first tree pass algorithm. For example, for a tree D shown in FIG. 3, $A_\alpha=\{x_1, x_4, x_2, x_5, x_3, x_6\}$, $A_\delta=\{x_2, x_5, x_3, x_6\}$, $A_\epsilon=\{x_2, x_5\}$, $A_\zeta=\{x_3, x_6\}$, and $A_\beta=\{x_1\}$.

Let $f(x_1, \ldots, x_n)$ be a Boolean function. A tree D is a symmetry tree for the function $f(x_1, \ldots, x_n)$ if the following conditions are met:

(i) the tree D has n leaves and each leaf of the tree D is marked by a variable from $X=\{x_1, \ldots, x_n\}$;

(ii) each internal node of the tree D is marked by a symbol N or S;

(iii) if a node $\beta$ of the tree D is marked by the symbol S, and $\beta_1, \ldots, \beta_m$ are sons of the node $\beta$, then $\{A_{\beta_1}, \ldots, A_{\beta_m}\}$ is maximal symmetric with respect to $f$, and $\{A_{\beta_1}, \ldots, A_{\beta_m}\}$ is maximal S-partition of the Set $A_\beta$; and (iv) if a node P of the tree D is marked by the symbol N, and $\beta_1, \ldots, \beta_m$ are sons of the node $\beta$, then the set $A_\beta$ is not S-set of the function $f$, and for each $i \in \{1, \ldots, m\}$, $\beta_i$ is not marked by the symbol N.

For example, FIG. 4 shows an exemplary symmetry tree for the function and3 in accordance with the present invention. FIG. 5 shows an exemplary symmetry tree for the function mux41 in accordance with the present invention. FIG. 6 shows an exemplary symmetry tree for the function $x_1 x_2 \to x_3 \vee x_4 = \bar{x}_1 \vee \bar{x}_2 \vee x_3 \vee x_4$ in accordance with the present invention.

It is noted that some Boolean functions may have several symmetry trees.

A method for constructing a symmetry tree for a Boolean function is described in co-pending U.S. patent application Ser. No. 10/299,564, filed Nov. 19, 2002.

B. Preliminary Preparation of Technology Library

A cell is an element of a technology library. Each cell may implement a Boolean function. For each cell of a technology library, a symmetry tree of the Boolean function realized by this cell may be constructed. The Boolean function realized by a cell may also be called the operation of the cell.

A cell (or a Boolean function) is m-commutative if the cell's symmetry tree has the form shown in FIG. 7, where the root of the symmetry tree is marked by a symbol S. The function and3 is an example of a 3-commutative operation. A cell (or an operation) is commutative if the cell is m-commutative for some $m \geq 2$.

A cell (or an operation) is m-noncommutative if the cell's symmetry tree has the form shown on FIG. 8, where the root of the symmetry tree is marked by a symbol N. The function $x_1 \to x_2$ is an example of a 2-noncommutative operation. A cell (or an operation) is noncommutative if the cell is m-noncommutative for some $m \geq 2$.

A cell (or an operation) is aggregative if the cell is neither commutative nor noncommutative. The function mux41 is an example of an aggregative operation.

For a symmetry tree D, C(D) (N(D) in the case of a m-commutative cell) may denote the maximal number of the sons of the nodes of the tree D, marked by symbol C(N).

Denote $M_C = \max_D C(D)$, $M_N = \max_D N(D)$, where D ranges over the set of the symmetry trees of the cells of the technology library.

To each integer $m \in \{2, \ldots, M_C\}$ ($m \in \{2, \ldots, M_N\}$), a m-commutative (m-noncommutative) cell from the technology library may be assigned. For a $m \in \{2, \ldots, M_C\}$ ($m \in \{2, \ldots, M_N\}$), if there is no m-commutative (m-noncommutative) cell, then a virtual m-commutative (m-noncommutative) cell may be added to the technology library.

Let c be an aggregative cell of the technology library. FIG. 9 shows an exemplary symmetry tree D of the cell c, where $P \in \{C, N\}$. The set Decomp(c)=$\{c_1, \ldots, c_m\}$ may be assigned to the cell c, where $c_i$ ($i=1, \ldots, m$) is a cell with a symmetry tree equal to the tree $D_i$ (if there is no such cell in the technology library, then an virtual cell may be added). The set Decomp(c) may be assigned to each aggregative cell c of the technology library.

Suppose $f$ is a m-commutative operation, where $m \geq 2$, $(f(A_1, \ldots, A_m), f(B_1, \ldots, B_m))$ is a pair of formulas, and $(A_i, B_j)$ is a pair such that $i, j \in \{1, \ldots, m\}$, then the pair $(f'(A_1, \ldots, A_{i-1}, A_{i+1}, \ldots, A_m), f'(B_1, \ldots, B_{j-1}, B_{j+1}, \ldots, B_m))$, where $f'$ is a (m-1)-commutative operation, is called the reduced pair for the pairs $(f(A_1, \ldots, A_m), f(B_1, \ldots, B_m))$ and $(A_i, B_j)$. If $f$ is a 2-commutative operation, then the pair $(A_{3-i}, B_{3-j})$ is a reduced pair for the pairs $(f(A_1, A_2), f(B_1, B_2))$ and $(A_i, B_j)$.

Suppose c is a cell which has the form of symmetry tree D shown in FIG. 9, Decomp(c)=$\{c_1, \ldots, c_m\}$, $f$ is the operation of the cell c, and $f_i$ ($i=1, \ldots, m$) is the operation of the cell $c_i$, then the formula $g(f_1(X_{\alpha_1}), \ldots, f_m(X_{\alpha_m}))$ is called the decomposition of the formula $f(X_\alpha)$, where g is a m-commutative operation if P=S and g is a m-noncommutative operation if P=N. Suppose $f$ is an aggregative operation, and $(f((A), f((B)))$ is a pair of formulas; then the pair $(A', B')$ is called decomposed pair for the pair $(f((A), f((B)))$ if $A'$ is the decomposition of $f(A)$ and $B'$ is the decomposition of $f(B)$.

C. Formula Representation

Now a function $\phi$ (referred as code) that takes a technology basis operation or a variable as its input and produces a natural number as its output is introduced. The code for different operations and different variables may be different. The code of an operation is smaller than the code of a variable. Moreover, $\phi(x_1) < \phi(x_2) \ldots$, i.e., the code of variables may increase with increasing indices.

Formulas may be represented by trees. Every vertex of such a tree may be marked by the code of an operation or a variable (if the vertex is a hanging one). The children of non-hanging vertices are the arguments of the corresponding operation. FIG. 10 shows an exemplary representation of the formula and2(or2($x_1$, $x_2$), not($x_3$)) in accordance with the present invention. The linear formula representation may be easily restored from the tree representation with the help of depth-first tree pass algorithm.

The result of the comparison of two formulas may be determined by the lexicographical order of the words composed of the operation codes in the linear form.

A formula is called standard if, for every formula operation, the arguments that may be permuted according to the input symmetry tree of this operation are ordered by the code (in ascending order).

If $\phi(\text{and}2) < \phi(\text{or}2)$, then the formulas and3($x_1$, or2(($x_2$, $x_3$), and2($x_4$, $x_5$))) and mux41($x_1$, or2(($x_2$, $x_3$), and2($x_7$, $x_8$), $x_4$, $x_5$, $x_6$)) are not in standard form, and the standard forms of these formulas are and3(and2($x_4$, $x_5$), or2($x_2$, $x_3$), $x_1$) and mux41($x_1$, and2($x_7$, $x_8$), or2($x_2$, $x_3$), $x_4$, $x_6$, $x_5$).

More detailed description of the standard form and the method for transforming a formula to the standard form may be found in U.S. Pat. No. 6,637,011, filed Oct. 2, 2000.

D. Formula Complexity

There may be four goals of the chip optimization. The first goal is to decrease the total cell area. Therefore, the first complexity measure of a formula is the area complexity. The area complexity of a formula is the total area of cells belonging to the formula.

The second goal of optimization is to eliminate ramptime violations of the nets. For any edge ($P_{in}$, $P_{out}$) of a cell, the transition delay of the edge should be not greater than a given value MaxRamptime $$\text{transition}(P_{in}, P_{out}) \le \text{MaxRamptime}. \qquad (1)$$

The transition delay is a function of the capacity of the net w connected to the output pin $P_{out}$. Thus, for any output pin $P_{out}$, a possible maximal capacity MaxCap($P_{out}$) of the net w which guarantees the validity of the equation (1) may be found. If the capacity Cap(w) of the net w exceeds MaxCap ($P_{out}$), then there is a ramptime violation on the net w. Therefore, the second complexity measure of a formula is the ramptime complexity. If a formula is represented by some logic of the chip, then the ramptime complexity of this formula is the sum of ramptime violations of the nets of the logic tree.

The third goal of optimization is the timing optimization, and the third complexity measure of a formula is the timing complexity. Suppose a formula is represented by a logic tree of the chip, and the formula is dependent on n variables $\{x_1, \ldots, x_n\}$ (i.e., the logic tree has n entrances), then for each $i \in \{1, \ldots, n\}$ in the initial logic tree, the delay $t_i$ between the i-th entrance and the output pin of the root of the logic tree may be calculated. A method to calculate the delay was described in U.S. Pat. No. 6,564,361, filed Oct. 2, 2000. The task of local logic optimization (see, e.g., U.S. Pat. No. 6,532,582, filed Oct. 2, 2000) may assign the number $r_i$ to each entrance $i \in \{1, \ldots, n\}$. If $r_i<0$, then the delay of the path between i-th entrance and the output pin of the root may be increased by $|r_i|$. If $r_i>0$, one may desire to decrease this path delay. The timing complexity of the initial tree may be equal to zero (0). Suppose a new equivalent logic tree is built, and $t_i$ is the delay of the path between i-th entrance and the output pin of the root of the new tree, then the timing complexity T of the new tree (and the complexity of the formula representing this tree) may be determined as follows:

(i) if ($t_i'-t_i>0$ and $r_i>0$) or ($t_i'-t_i+r_i>0$ and $r_i<0$) for some $i \in \{1, \ldots, n\}$, then $T=\infty$;

$$\text{(ii) otherwise, } T = \sum_{i=1}^{n} \max(0, \min(t_i' - t_i, r_i)).$$

The fourth goal of optimization is the hold time optimization. If one aim of the timing optimization is to decrease delays of the slow paths, then one aim of the hold time optimization is to increase delays of too fast paths. The hold time complexity may be introduced by analogy with the timing complexity. Let $t_i$ be the hold time delay between the i-th entrance and the output pin of the root of the initial logic tree (i=1, ..., n). Let $r_i$ be the number assigned to the i-th entrance by the local optimization task. If $r_i<0$, then the hold time delay of the path between the i-th entrance and the output pin of the root may be decreased by $|r_i|$. If $r_i>0$, one may desire to increase the path delay. The hold time complexity of the initial tree may be equal to zero (0). Let $t_i$ be the hold time delay between the i-th entrance and the output pin of the root of the new equivalent logic tree (i= 1, ..., n). The hold time complexity T of the new tree (and the complexity of the formula representing this tree) may be determined as follows:

(i) if ($t_i-t_i'<0$ and $r_i>0$) or ($t_i-t_i'+r_i>0$ and $r_i<0$) for some $i \in \{1, \ldots, n\}$, then $T=\infty$;

$$\text{(ii) otherwise, } T = \sum_{i=1}^{n} \max(0, \min(t_i - t_i', r_i)).$$

There are many ways to compare formula complexities. For example, the following is a method for comparing formulas. Suppose a formula A has complexities (t, h, r, a), where t is the timing complexity, h is the hold time complexity, r is the ramptime complexity, and a is the area complexity. Suppose B is a new formula logically equivalent to the formula A with complexities (t', h', r', a'). If t'=∞ or h'=∞, then the formula A is better than the formula B. If r'<r, then the formula B is better than the formula A. If r'=r and t'<t, then the formula B is better than the formula A. If r'=r, t'=t, and h'<h, then the formula B is better than the formula A. If r'=r, t'=t, h'=h, and a'<a, then the formula B is better than the formula A. Otherwise, the formula A is better than the formula B. This method to compare formula complexities has been used in LSI Logic Corp.'s internal synthesis tool MRS (see, e.g., U.S. Pat. No. 6,564,361, filed Oct. 2, 2000) during the timing optimization stage.

E. Procedure to Find Optimal Unification Substitution

Let $f(A_1, \ldots, A_n)=e(C_1, \ldots, C_q)$ be an identity in standard form, and $g(B_1, \ldots, B_m)$ be a formula in standard form. The present procedure may allow optimal application of the identity to the formula to be found. The present procedure may recursively call itself. The input of the procedure is a list L of pairs of formulas which one may unify, an ordered set S of substitutions for variables, right part of the identity, and information I on the best application. Suppose $x_1, \ldots, x_p$ are variables of the formula $f(A_1, \ldots, A_n)$, then denote $S=\{s_1, \ldots, s_p\}$, where $s_i$ is the substitution for variable $x_i$ (i=1, ..., p). If the substitution for variable $x_i$ is not known yet, then $s_i=\emptyset$. The information I is the aggregation $\{t, h, r, a, p\}$, where t is the timing complexity, h is the hold time complexity, r is the ramptime complexity, a is the area complexity, and p is the pointer of optimal application. If optimal application is not known yet, then $p=\emptyset$. For the initial call of the present procedure, the list L may contain only one pair ($f(A_1, \ldots, A_n)$, $g(B_1, \ldots, B_m)$), $s_i=\emptyset$ for each i=1, ..., p, right part of the identity is $e(C_1, \ldots, C_q)$, fields t, h, r, a of the information I are complexities of formula $g(B_1, \ldots, B_m)$, and p is equal to $\emptyset$.

FIGS. 11A and 11B illustrate a flowchart showing an exemplary method or process 1100 for finding an optimal unification substitution in accordance with the present invention. As shown, the process 1100 may start with a step 100, at which an input to the process 1100 is received. The input may include a list L of pairs of formulas in standard form, a set S of substitutions for variables, a right part $e(x_1, \ldots, x_p)$ of an identity, an information I=\{t, h, r, a, p\} on best application.

Next at a step 102, an inquiry may be held to check whether the list L is empty. If the answer to the inquiry at the step 102 is yes (i.e., the list L is empty), which means that the unification substitution has been constructed, i.e. $s_i \neq \emptyset$ for each i=1, . . . , p, then at step 104 the new application is made, the information on best application is updated, and the procedure is completed. The new application $q(x_1, \ldots, x_p)$ may be made or obtained as a result of substitution of formulas $s_i$(i=1, . . . , p) for variables $x_i$ of formula $e(x_1, \ldots, x_p)$, i.e. $q(x_1, \ldots, x_p) = e(s_i, \ldots, s_p)$. The complexities (t', h', r', a') of formula $q(x_1, \ldots, x_p)$ may be calculated and the pair of complexities (t, h, r, a) and (t', h', r', a') may be compared as described in the foregoing described section "Formula Complexity", where (t, h, r, a) is taken from the information I. If (t', h', r', a') is better than (t, h, r, a), then the information I is updated, i.e. t is assigned to be equal to t', h is assigned to be equal to h', r is assigned to be equal to r', a is assigned to be equal to a', and p is assigned to be equal to the pointer on $q(x_1, \ldots, x_p)$. After this, one may exit from the process 1100.

If the answer to the inquiry at the step 102 is no (i.e., the list L is not empty), then at step 106 the first pair $(f'(A'_1, \ldots, A'_n), g'(B'_1, \ldots, B'_{m'}))$ may be extracted and removed from the list L.

At step 108, the head inverters and buffers are removed from formulas $f'(A'_1, \ldots, A'_n)$ and $g'(B'_1, \ldots, B'_{m'})$ (For formula $f(A_1, \ldots, A_n)$, the operation $f$ is called the head). If heads of formulas $f'$ and $g'$ are inverters, then these inverters may be removed, i.e. if $f' = \text{not}(f''(A''_1, \ldots, A''_{n''}))$ and $g' = \text{not}(g''(B''_1, \ldots, B''_{m''}))$, then the pair of the formulas $(f''(A''_1, \ldots, A''_{n''}), g''(B''_1, \ldots, B''_{m''}))$ may be obtained. This operation may be repeated if possible. Then the heads of the formulas may be removed if these heads are buffers. This operation may be repeated if possible. The result of these operations may be denoted as $(f(A_1, \ldots, A_n), g(B_1, \ldots, B_m))$. For example, if $f' = \text{not}(\text{not}(\text{buf}(\text{buf}(f(A_1, \ldots, A_n)))))$, $g' = \text{not}(\text{not}(\text{buf}(g(B_1, \ldots, B_m))))$, then after the step 108, the pair $(f(A_1, \ldots, A_n), g(B_1, \ldots, B_m))$ may be obtained.

At step 110, an inquiry may be held to check if $f$ is a variable. If $f = x_i$ (i.e., formula $f$ is a variable), then the process 1100 proceeds to step 112; otherwise, the process 1100 may proceed to step 116.

At the step 112, a determination of whether the formula $g(B_1, \ldots, B_m)$ may be substituted for the variable $x_i$ may be performed. When $s_i \neq \emptyset$, or when the formulas $s_i$ and g are equal, then the formula g may be substituted for the variable $x_i$; otherwise, g may not be substituted for the variable $x_i$. If g may not be substituted for the variable $x_i$, then at step 118 one may exit from the process 1100. If g may be substituted for the variable $x_i$, then at step 114 one may set $s_i = g(B_1, \ldots, B_m)$, and the process 1100 may loop back to the step 102.

At the step 116, a determination of whether the heads of the formulas $f(A_1, \ldots, A_n)$ and $g(B_1, \ldots, B_m)$ are equal (i.e. $f = g$) may be performed. If $f \neq g$, then at the step 118, one may exit from the process 1100. If $f = g$, then at step 120, whether $f$ is constant may be checked. If $f$ is constant, then the process 1100 may loop back to the step 102. If $f$ is not constant, then at step 122, whether $f$ is a noncommutative operation may be checked. If the answer is yes (i.e., $f$ is a noncommutative operation), then at step 124, one may add the pairs $(A_1, B_1), \ldots, (A_n, B_n)$ to the list L, and the process 1100 may loop back to the step 102 (note that $f = g$, therefore n=m). If the answer is no (i.e., $f$ is not a noncommutative operation), then the process 1100 may proceed to step 126.

At the step 126, a determination of whether $f$ is an aggregative operation may be performed. If the answer is yes (i.e., $f$ is an aggregative operation), then the process 1100 may proceed to step 128, at which one may form the decomposed pair for the pair $(f(A_1, \ldots, A_n), f(B_1, \ldots, B_n))$ as described in the foregoing section "Preliminary Preparation of Technology Library", and add the decomposed pair to the list L, and the process 1100 may then loop back to the step 102. If the answer is no (i.e., $f$ is not an aggregative operation), then the process 1100 may proceed to step 130.

If the process 1100 proceeds to the step 130, then $f$ may be a commutative operation. At the step 130, one may search for a basic argument of the formula $f(A_1, \ldots, A_n)$. One may search for the basic argument of the formula $f(A_1, \ldots, A_n)$ as follows. Since the formula $f(A_1, \ldots, A_n)$ is in standard form, one may partition the set $\Phi = \{A_1, \ldots, A_n\}$ into sets $$\Phi = \bigcup_{i=1}^{q} \Phi_i,$$

where $\Phi_i = \{A_{1+l_{i-1}}, \ldots, A_{l_i}\}$, $l_0 = 0$, $l_q = n$, such that all formulas from one partition part have equal heads. If $A_n$ is a variable, then the part $\Phi_q$ contains all variables. In this case, one may set d=q-1; otherwise, d=q. Denote the head of the formulas from $\Phi_i$ by $H_i$ (i=1, . . . , d). Similarly, one may partition the set $\Psi = \{B_1, \ldots, B_n\}$ into sets $\Psi_i = \{B_{1+l'_{i-1}}, \ldots, B_{l'_i}\}$, i=1, . . . , q', $l'_0 = 0$, $l'_{q'} = n$. If $B_n$ is a variable, then one may set d'=q'-1; otherwise, d'=q'. Denote the head of the formulas $\Psi_i$ by $H'_i$ (i=1, . . . , d'). If for some $j \in \{1, \ldots d\}$, there is no such $i \in \{1, \ldots, d'\}$ that $H_j = H'_i$, or $H_j = H'_i$ and $l_j - l_{j-1} \geq 1'_i - 1'_{i-1}$, then one may not find the basic argument of the formula $f(A_1, \ldots, A_n)$. Otherwise, one may find such $i' \in \{1, \ldots, d'\}$ that $1'_{i'} - 1'_{i'-1}$ is minimal. Let $i \in \{1, \ldots, d\}$ be the number so that $H_i = H'_{i'}$. The formula $A_j = A_{l_i}$ is the basic argument of the formula $f(A_1, \ldots, A_n)$. Let P be the head of the formula $A_j$.

At step 132, a determination of whether the basic argument has been found may be performed. If the basic argument has not been found, then at step 134 one may exit from the process 1100. If the basic argument has been found, then at step 136 one may set i=1 and the process 1100 may proceed to step 138.

At the step 138, a determination of whether the head of the formula $B_i$ is equal to P may be performed. If the answer is no (i.e., the head of the formula $B_i$ is not equal to P), then the process 1100 may proceed to step 140; otherwise, the process 1100 may proceed to step 144.

At the step 140, one may set i=i+1, and the process 1100 may then proceed to step 142, at which whether i>n may be checked. If i>n, then at the step 134 one may exit from the process 1100; otherwise, the process 1100 may loop back to the step 138.

At the step 144, one may make copy L' of the list L and make copy S' of the set S.

At the step 146, one may form the reduced pair (A', B') for the pairs $(f(A_1, \ldots, A_n), f(B_1, \ldots, B_n))$ and $(A_j, B_i)$ as described in the foregoing section "Preliminary Preparation of Technology Library". Then the pairs $(A_j, B_i)$ and (A', B') may be added to the list L'.

At step 148, the foregoing-described steps to find optimal unification substitution may be recursively applied for the list L', the set S', the formula $e(x_1, \ldots, x_p)$, and the information I={t, h, r, a, p}. Then the process 1100 may proceed to the step 140.

When the process 1100 to find optimal unification substitution is completed, if the field p of the information I is equal to ∅, then there is no improving unification substitution; if p≠∅, then p is the pointer to optimal application of the identity $f(A_1, \ldots, A_n)=e(C_1, \ldots, C_q)$ to the formula $g(B_1, \ldots, B_m)$.

It is to be noted that the above described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of software package. Such a software package may be a computer program product which employs a storage medium including stored computer code which isused to program a computer to perform the disclosed function and process of the present invention. The storage medium may include, but is not limited to, any type of conventional floppy disks, optical disks, CD-ROMS, magneto-optical disks, ROMs, RAMs, EPROMs, EEPROMs, magnetic or optical cards, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for finding an optimal unification substitution for formulas in a technology library during integrated circuit design, comprising steps of:

(a) receiving input, said input including a list L of pairs of formulas in standard form, a set S of substitutions for variables, a right part $e(x_1, \ldots, x_p)$ of an identity, and an information I={t, h, r, a, p} on best application;

(b) when said list L is not empty, extracting and removing first pair $(f'(A'_1, \ldots, A'_{n'}), g'(B'_1, \ldots, B'_{m'}))$ from said list L;

(c) removing head inverters and buffers from formulas $f'(A'_1, \ldots, A'_{n'})$ and $g'(B'_1, \ldots, B'_{m'})$ and obtaining a pair $(f(A_1, \ldots, A_n), g(B_1, \ldots, B_m))$;

(d) when said $f$ is a commutative operation but neither a variable nor constant, and when heads of said formulas $f(A_1, \ldots, A_n)$ and $g(B_1, \ldots, B_m)$ are equal, searching for a basic argument $A_j$ of said formula $f(A_1, \ldots, A_n)$;

(e) when said basic argument $A_j$ is found, letting P be head of said $A_j$ and setting i=1;

(f) when head of $B_i$ is equal to said P, making copy L' of said list L and making copy S' of said set S; and (g) forming a reduced pair (A', B') for pairs $(f(A_1, \ldots, A_n), f(B_1, \ldots, B_n))$ and $(A_j, B_i)$ and adding said pairs $(A_j, B_i)$ and (A', B') to said list L'.

2. The method of claim 1, further comprising a step of repeating said steps (a) through (g) for said list L', said set S', said formula $e(x_1, \ldots, x_p)$, and said information I={t, h, r, a, p}.

3. The method of claim 1, wherein said step (b) further comprising when said list L is empty, making new application and updating said information I={t, h, r, a, p} on best application.

4. The method of claim 1, wherein said step (d) further comprising when said $f$ is a variable and said formula $g(B_1, \ldots, B_m)$ can be substituted for said variable $f$, setting $s_i=g(B_1, \ldots, B_m)$, and returning to said step (b).

5. The method of claim 1, wherein said step (d) further comprising when said $f$ is constant but not a variable and when heads of said formulas $f(A_1, \ldots, A_n)$ and $g(B_1, \ldots, B_m)$ are equal, returning to said step (b).

6. The method of claim 1, wherein said step (d) further comprising when said $f$ is a noncommutative operation but neither a variable nor constant and when heads of said formulas $f(A_1, \ldots, A_n)$ and $g(B_1, \ldots, B_m)$ are equal, adding pairs $(A_1, B_1), \ldots, (A_n, B_n)$ to said list L and returning to said step (b).

7. The method of claim 1, wherein said step (d) further comprising when said $f$ is an aggregative operation but neither a variable nor constant and when heads of said formulas $f(A_1, \ldots, A_n)$ and $g(B_1, \ldots, B_m)$ are equal, forming decomposed pair, adding said decomposed pair to said list L, and returning to said step (b).

8. The method of claim 1, wherein said step (f) further comprising steps of:

(f1) when said head of $B_i$ is not equal to said P, setting i=i+1; and (f2) when said i is not greater than n, returning to said step (f).

9. An apparatus for finding an optimal unification substitution for formulas in a technology library during integrated circuit design, comprising:

(a) means for receiving input, said input including a list L of pairs of formulas in standard form, a set S of substitutions for variables, a right part $e(x_1, \ldots, x_p)$ of an identity, and an information I={t, h, r, a, p} on best application;

(b) when said list L is not empty, means for extracting and removing first pair $(f'(A'_1, \ldots, A'_{n'}), g'(B'_1, \ldots, B'_{m'}))$ from said list L;

(c) means for removing head inverters and buffers from formulas $f'(A'_1, \ldots, A'_{n'})$ and $g'(B'_1, \ldots, B'_{m'})$ and means for obtaining a pair $(f(A_1, \ldots, A_n), g(B_1, \ldots, B_m))$;

(d) when said $f$ is a commutative operation but neither a variable nor constant, and when heads of said formulas $f(A_1, \ldots, A_n)$ and $g(B_1, \ldots, B_m)$ are equal, means for searching for a basic argument $A_j$ of said formula $f(A_1, \ldots, A_n)$;

(e) when said basic argument $A_j$ is found, means for letting P be head of said $A_j$ and means for setting i=1;

(f) when head of $B_i$ is equal to said P, means for making copy L' of said list L and means for making copy S' of said set S; and (g) means for forming a reduced pair (A', B') for pairs $(f(A_1, \ldots, A_n), f(B_1, \ldots, B_n))$ and $(A_j, B_i)$ and means for adding said pairs $(A_j, B_i)$ and (A', B') to said list L'.

10. The apparatus of claim 9, further comprising when said list L is empty, means for making new application and means for updating said information I={t, h, r, a, p} on best application.

11. The apparatus of claim 9, further comprising when said $f$ is a variable and said formula $g(B_1, \ldots, B_m)$ can be substituted for said variable $f$, means for setting $s_i = g(B_1, \ldots, B_m)$.

12. The apparatus of claim 9, further comprising when said $f$ is a noncommutative operation but neither a variable nor constant and when heads of said formulas $f(A_1, \ldots, A_n)$ and $g(B_1, \ldots, B_m)$ are equal, means for adding pairs $(A_1, B_1), \ldots, (A_n, B_n)$ to said list L.

13. The apparatus of claim 9, further comprising when said $f$ is an aggregative operation but neither a variable nor constant and when heads of said formulas $f(A_1, \ldots, A_n)$ and $g(B_1, \ldots, B_m)$ are equal, means for forming decomposed pair and means for adding said decomposed pair to said list L.

14. The apparatus of claim 9, further comprising when said head of $B_i$ is not equal to said P, means for setting i=i+1.

15. A computer-readable medium having computer-executable instructions for performing a method for finding an optimal unification substitution for formulas in a technology library during integrated circuit design, said method comprising steps of:
   (a) receiving input, said input including a list L of pairs of formulas in standard form, a set S of substitutions for variables, a right part $e(x_1, \ldots, x_p)$ of an identity, and an information I={t, h, r, a, p} on best application;
   (b) when said list L is not empty, extracting and removing first pair $f'(A'_1, \ldots, A'_{n'}), g'(B'_1, \ldots, B'_{m'}))$ from said list L;
   (c) removing head inverters and buffers from formulas $f'(A'_1, \ldots, A'_{n'})$ and $g'(B'_1, \ldots, B'_{m'}))$ and obtaining a pair $(f(A_1, \ldots, A_n), g(B_1, \ldots, B_m))$;
   (d) when said $f$ is a commutative operation but neither a variable nor constant, and when heads of said formulas $f(A_1, \ldots, A_n)$ and $g(B_1, \ldots, B_m)$ are equal, searching for a basic argument $A_j$ of said formula $f(A_1, \ldots, A_n)$;
   (e) when said basic argument $A_j$ is found, leffing P be head of said $A_j$ and setting i=1;
   (f) when head of $B_i$ is equal to said P, making copy L' of said list L and making copy S' of said set S; and
   (g) forming a reduced pair (A', B') for pairs $(f(A_1, \ldots, A_n), f(B_1, \ldots, B_n))$ and $(A_j, B_i)$ and adding said pairs $(A_j, B_i)$ and (A', B') to said list L'.

16. The computer-readable medium of claim 15, wherein said method further comprising a step of repeating said steps (a) through (g) for said list L', said set S', said formula $e(x_1, \ldots, x_p)$, and said information I={t, h, r, a, p}.

17. The computer-readable medium of claim 15, wherein said step (b) further comprising when said list L is empty, making new application and updating said information I={t, h, r, a, p} on best application.

18. The computer-readable medium of claim 15, wherein said step (d) further comprising when said $f$ is a variable and said formula $g(B_1, \ldots, B_m)$ can be substituted for said variable $f$, setting $s_i = g(B_1, \ldots, B_m)$, and returning to said step (b).

19. The computer-readable medium of claim 15, wherein said step (d) further comprising when said $f$ is constant but not a variable and when heads of said formulas $f(A_1, \ldots, A_n)$ and $g(B_1, \ldots, B_m)$ are equal, returning to said step (b).

20. The computer-readable medium of claim 15, wherein said step (d) further comprising when said $f$ is a noncommutative operation but neither a variable nor constant and when heads of said formulas $f(A_1, \ldots, A_n)$ and $g(B_1, \ldots, B_m)$ are equal, adding pairs $(A_1, B_1), \ldots, (A_n, B_n)$ to said list L and returning to said step (b).

21. The computer-readable medium of claim 15, wherein said step (d) further comprising when said $f$ is an aggregative operation but neither a variable nor constant and when heads of said formulas $f(A_1, \ldots, A_n)$ and $g(B_1, \ldots, B_m)$ are equal, forming decomposed pair, adding said decomposed pair to said list L, and returning to said step (b).

22. The computer-readable medium of claim 15, wherein said step (f) further comprising steps of:
   (f1) when said head of $B_i$ is not equal to said P, setting i=i+1; and
   (f2) when said i is not greater than n, returning to said step (f).

* * * * *